(12) United States Patent
Chamberlain et al.

(10) Patent No.: US 7,786,729 B2
(45) Date of Patent: Aug. 31, 2010

(54) METHOD FOR MAGNETIC RESONANCE IMAGING

(75) Inventors: Ryan Chamberlain, New Brighton, MN (US); Jang-Yeon Park, Minneapolis, MN (US); Michael G. Garwood, Medina, MN (US)

(73) Assignee: Regents of the University of Minnesota, St. Paul, MN (US)

(*) Notice: Subject to any disclaimer, the term of this patent is extended or adjusted under 35 U.S.C. 154(b) by 0 days.

(21) Appl. No.: 11/931,968

(22) Filed: Oct. 31, 2007

(65) Prior Publication Data

US 2008/0204020 A1 Aug. 28, 2008

Related U.S. Application Data

(60) Provisional application No. 60/863,681, filed on Oct. 31, 2006.

(51) Int. Cl.
*G01V 3/00* (2006.01)

(52) U.S. Cl. ....................................... 324/309

(58) Field of Classification Search ......... 324/300–322; 600/410–435
See application file for complete search history.

(56) References Cited

U.S. PATENT DOCUMENTS

| | | | |
|---|---|---|---|
| 3,968,424 A | 7/1976 | Ernst | |
| 3,975,675 A | 8/1976 | Dunand et al. | |
| 4,117,481 A | 9/1978 | Constant | |
| 4,209,843 A | 6/1980 | Hyatt | |
| 4,228,395 A | 10/1980 | Duscheck, Jr. et al. | |
| 4,553,213 A | 11/1985 | Hyatt | |
| 4,553,221 A | 11/1985 | Hyatt | |
| 4,581,715 A | 4/1986 | Hyatt | |
| 4,602,641 A | 7/1986 | Feinberg | |
| 4,658,252 A | 4/1987 | Rowe | |

(Continued)

FOREIGN PATENT DOCUMENTS

JP 05023314 A * 2/1993

(Continued)

OTHER PUBLICATIONS

Idiyatullin et al., "Fast and quiet MRI using a swept radiofrequency", *Journal of Magnetic Resonance*, Academic Press, Orlando, FL., vol. 181, No. 2, Aug. 2006, pp. 342-349, XP005569620 ISSN: 1090-7807.

(Continued)

*Primary Examiner*—Brij B Shrivastav
*Assistant Examiner*—Dixomara Vargas
(74) *Attorney, Agent, or Firm*—Schwegman, Lundberg & Woessner, P.A.

(57) ABSTRACT

A method of magnetic resonance imaging based on rapid acquisition by sequential excitation and refocusing is provided. The method comprises turning on a first time-encoding gradient and applying an excitation pulse in the presence of the first time-encoding gradient. The excitation pulse excites magnetization sequentially along one spatial axis. Thereafter, a first refocusing pulse is applied. A second time-encoding gradient is turned on followed by a second refocusing pulse. A third time-encoding gradient is turned on and a signal is acquired in the presence of the third time-encoding gradient. The third time-encoding gradient sums to zero with the first time-encoding gradient and the second time-encoding gradient for sequential points in space.

33 Claims, 8 Drawing Sheets

U.S. PATENT DOCUMENTS

| | | | |
|---|---|---|---|
| 4,678,996 A * | 7/1987 | Haacke et al. | 324/309 |
| 4,686,655 A | 8/1987 | Hyatt | |
| 4,701,736 A | 10/1987 | McDougall et al. | |
| 4,913,152 A | 4/1990 | Ko et al. | |
| 4,944,036 A | 7/1990 | Hyatt | |
| 5,053,983 A | 10/1991 | Hyatt | |
| 5,248,882 A | 9/1993 | Liang | |
| 5,541,512 A * | 7/1996 | Dumoulin et al. | 324/309 |
| 5,608,322 A * | 3/1997 | Lonergan et al. | 324/309 |
| 5,869,959 A | 2/1999 | Tomikawa | |
| 6,201,392 B1 | 3/2001 | Anderson et al. | |
| 6,392,408 B1 | 5/2002 | Barrall et al. | |
| 6,734,672 B2 * | 5/2004 | Feiweier | 324/309 |
| 6,740,518 B1 | 5/2004 | Duong et al. | |
| 6,804,546 B1 * | 10/2004 | Thompson et al. | 600/410 |
| 6,815,952 B1 * | 11/2004 | Rose et al. | 324/307 |
| 2005/0016276 A1 | 1/2005 | Guan et al. | |
| 2007/0188171 A1 | 8/2007 | Garwood et al. | |

FOREIGN PATENT DOCUMENTS

| | | |
|---|---|---|
| WO | WO 96/10193 | 4/1996 |
| WO | WO 01/70109 | 9/2001 |

OTHER PUBLICATIONS

Joshi, J. P. et al., "Rapid-scan EPR with triangular scans and fourier deconvolution to recover the slow-scan spectrum", *Journal of Magnetic Resonance*, Academic Press, Orlando, FL., vol. 175, No. 1, Jul. 2005, pp. 44-51, XP004929524.

R.K. Gupta et al., "Rapid Scan Fourier Transform NMR Spectroscopy", *Journal of Magnetic Resonance*, vol. 13, 1974, pp. 275-290, XP009076756.

Sindorf, D.W. et al., "Wide-Line NMR Spectroscopy in Solids Using Variable Frequency Pulses", *Journal of Magnetic Resonance*, Academic Press, Orlando, FL, vol. 85, No. 3, Dec. 1, 1989, pp. 581-585, XP000102286 ISSN: 1090-7807.

Davies, G.R. et al., "Continous-Wave Magnetic Resonance Imaging of Short T2 Materials", *Journal of Magnetic Resonance*, Academic Press, Orlando, FL, vol. 148, No. 2, Feb. 2001, pp. 289-297., XP004406677.

J.W. Stoner et al., "Direct-detected rapid-scan EPR at 250 MHz", *Journal of Magnetic Resonance*, vol. 170, 2004, pp. 127-135, XP002414028.

J.-Y. Park et al., "Imaging Pseudo-Echoes Produced by a Frequency-Swept Pulse", *Proc. Intl. Soc. Mag. Reson. Med. 11*, 2004, p. 534, XP002414030.

Gatehouse, P.D. et al., "Magnetic Resonance Imaging of Short T2 Components in Tissue", *Clinical Radiology*, Livingstone, Harlow, GB, vol. 58, No. 1, Jan. 2003, pp. 1-19, XP009033520, ISSN: 0009-9260.

Madio, D.P. et al., "Ultra-Fast Imaging Using Low Flip Angles and Fids", *Magnetic Resonance in Medicine*, Academic Press, Duluth, MN, vol. 34, No. 4, Oct. 1, 1995, pp. 525-529, XP000535685, ISSN: 0740-3194.

A.H. Herlihy et al., "Continuous Scanning using Single Fast Spin Echo on a Short Bore Neonatal Scanner", *Proc. Intl. Soc. Mag. Reson. Med. 6*, 1998, p. 1942, XP002414435.

* cited by examiner

METHOD FOR MAGNETIC RESONANCE IMAGING

CROSS REFERENCE TO RELATED APPLICATION(S)

This application is claims benefit of U.S. Provisional Patent Application No. 60/863,681, filed Oct. 31, 2006, the contents of which is hereby incorporated by reference

STATEMENT REGARDING FEDERALLY SPONSORED RESEARCH OR DEVELOPMENT

This invention was made with government support under grant numbers P41-RR008079, 1P30-NS057091-01, and 1R01-CA092004-01A1, from the National Institutes of Health (NIH). The government has certain rights in this invention.

FIELD

A method of magnetic resonance imaging is provided. More specifically, a method of magnetic resonance imaging based on rapid acquisition by sequential excitation and refocusing is provided.

BACKGROUND

Traditional fast MRI sequences collect multiple echoes per excitation, each echo having a different echo time. In a train of spin echoes, each successive echo has a decreased signal. Thus, collecting a train of spin echoes with different echo times generally degrades resolution; the decrease in signal with each echo is analogous to an apodization function. For example, during the train of gradient echoes in echo planar imaging (EPI), image blurring cannot be avoided due to the relatively short effective transverse relaxation time ($T_2^*$); thus, EPI is not a suitable sequence for resolving small objects.

Pulse sequences using sequential excitation and/or refocusing of spins along the direction of an applied field gradient have been developed in the past. In their paper, "A Time Encoding Method for Single-Shot Imaging," Meyerand et al. introduced a time-encoding sequence that uses a series of pulses to excite different slices, followed by a single 180° pulse to create spin echoes that are read out in opposite order. Magn Reson Med, 1995. 34: p. 618-622. Although this sequence produces a series of spin echoes, the echo time (TE) of the different echoes varies widely across the object. Further, in Meyerand sequences, fast gradient switching is needed between 90° pulses.

The Meyerand et al. technique is a multi-slice technique having gaps between slices. As can be appreciated, information is lost in the gaps between the slices.

Frydman et al. introduced a rapid MRI method which exploits a chirp pulse to spatially-encode one dimension instead of frequency encoding. Tal, A. and L. Frydman, *Spatial Encoding and the Single-Scan Acquisition of High Definition MR Images in Inhomogeneous Fields*. J Magn Reson, 2006. 181: p. 179-194; Shrot, Y. and L. Frydman, *Spatially Encoded NMR and the Acquisition of 2D Magnetic Resonance Images with a Single Scan*. J Magn Reson, 2005. 172: p. 179-190. Although this method makes use of a novel spatial-encoding scheme, it does not solve susceptibility problems arising from $T_2^*$ decay throughout the echo train.

Dante fast imaging sequences have also been developed. These include, for example, BURST, DUFIS, and URGE. BURST and its variants are ultrafast imaging sequences that use the sidebands of the DANTE train to delineate pixels in the frequency-encoded direction. In BURST sequences an echo is formed and image reconstruction requires Fourier transformation (FT) in each dimension For a given pixel in BURST, the DANTE train excites a strip that is narrower than the pixel width. Several approaches have been proposed to improve the signal-to-noise ratio (SNR) of DANTE-based imaging methods. One method uses a frequency-modulated (FM) DANTE. Although FM-DANTE offers an improvement over the original BURST sequence in terms of SNR, intrapixel (voxel) phase cancellation occurs due to the quadratic phase of the excitation pulse.

Accordingly, it would be useful to have a technique with contiguous slices where no information is thus lost in gaps between slices. It would be further be useful to have a method of sequential magnetization that avoids susceptibility artifacts and blurring due to $T_2$ (or $T_2^*$) decay, experiences a uniform flip angle (for example, a 90° flip angle) across the object, and, the relative transverse magnetization ($M_{xy}$) is uniform in the time-encoded direction (i.e., no gaps between pixels).

SUMMARY

A method of magnetic resonance imaging based on rapid acquisition by sequential excitation and refocusing is provided.

In one embodiment, the method comprises applying a frequency-swept chirp excitation pulse, turning on an acquisition gradient in a time-encoding direction during an acquisition window, and turning on an alternating frequency-encoding gradient in a different direction to the acquisition gradient. A signal is acquired in the presence of the acquisition gradient and the alternating gradient, the signal being time-encoded and frequency-encoded and being substantially contiguous, and the signal is used to create two dimensions of an image.

In another embodiment, a method for multi-slice magnetic resonance imaging is provided. The method comprises turning on a selection gradient and applying an excitation pulse in the presence of the selection gradient, the excitation pulse exciting magnetization sequentially along one spatial axis. The method then comprises turning on a phase-encoding gradient, applying a first refocusing pulse, turning on a refocusing gradient, and applying a second refocusing pulse. The method then comprises turning on an acquisition gradient, turning on an alternating frequency encoding gradient in a different direction to the acquisition gradient, and acquiring a signal in the presence of the acquisition gradient and the alternating frequency encoding gradient, the signal being time-encoded and frequency-encoded. The acquisition gradient sums to zero with the selection gradient and the refocusing gradient for sequential points in space. A plurality of slices are acquired.

In a further embodiment for multi-slice magnetic resonance imaging, the method comprises turning on a time-encoding selection gradient and applying a frequency-swept chirp pulse in the presence of the time-encoding selection gradient, the excitation pulse exciting magnetization sequentially along one spatial axis. The method then comprises turning on a phase-encoding gradient, applying a first refocusing pulse, turning on a time-encoding refocusing gradient, and applying a second refocusing pulse. Thereafter, the method comprises turning on a time-encoding acquisition gradient, turning on an alternating frequency encoding gradient in an orthogonal direction to the acquisition gradient, and acquiring a signal in the presence of the acquisition gradient and the alternating frequency encoding gradient, the signal being time-encoded and frequency-encoded. The acquisition gradient sums to zero with the selection gradient and the refocusing gradient for sequential points in space. A plurality of slices are acquired.

In accordance with yet another embodiment, a method for single-shot magnetic resonance imaging is provided. The method comprises turning on a selection gradient and applying an excitation pulse in the presence of the selection gradient, the excitation pulse exciting magnetization sequentially along one spatial axis. The method then comprises applying a first refocusing pulse, turning on a first slice selection gradient approximately concurrently with the first refocusing pulse, turning on a refocusing gradient, applying a second refocusing pulse, and turning on a second slice selection gradient approximately concurrently with the second refocusing pulse. Thereafter, the method comprises turning on an acquisition gradient, turning on an alternating frequency encoding gradient in a different direction to the acquisition gradient, and acquiring a signal in the presence of the acquisition gradient and the alternating frequency encoding gradient, the signal being time-encoded and frequency-encoded. The acquisition gradient sums to zero with the selection gradient and the refocusing gradient for sequential points in space.

In a further embodiment of single-shot magnetic resonance imaging, the method comprises turning on a time-encoding selection gradient and applying a 90° frequency-swept excitation pulse in the presence of the time-encoding selection gradient, the excitation pulse exciting magnetization sequentially along one spatial axis. The method then comprises applying a first 180° refocusing pulse, turning on a first slice selection gradient approximately concurrently with the first refocusing pulse, turning on a time-encoding refocusing gradient, applying a second 180° refocusing pulse, and turning on a second slice selection gradient approximately concurrently with the second refocusing pulse. Thereafter, the method comprises turning on a time-encoding acquisition gradient, turning on an alternating frequency encoding gradient in an orthogonal direction to the acquisition gradient, and acquiring a signal in the presence of the time-encoding acquisition gradient and the alternating frequency encoding gradient, the signal being time-encoded and frequency-encoded. The acquisition gradient sums to zero with the selection gradient and the refocusing gradient for sequential points in space.

While multiple embodiments are disclosed, still other embodiments of the present invention will become apparent to those skilled in the art from the following detailed description. As will be apparent, the method disclosed herein is capable of modifications in various obvious aspects, all without departing from the spirit and scope of the present techniques. Accordingly, the detailed description is to be regarded as illustrative in nature and not restrictive.

DETAILED DESCRIPTION

A method of magnetic resonance imaging based on rapid acquisition by sequential excitation and refocusing, referred to as RASER, is provided. The method may be used for performing, for example, single-shot and fast multislice magnetic resonance imaging (MRI). In some embodiments, RASER acquires a $T_2$-weighted image from a single slice in a single shot.

RASER uses a pulse sequence in which multiple local spin echoes per excitation are acquired such that the local spin echoes have the same echo time (TE), and the local spin echoes are $T_2$-weighted, (as opposed to spin-echo EPI in which all echoes except one are $T_2^*$ weighted). Any excitation pulse with frequency and/or gradient modulation can be used to perform rapid acquisition by sequential excitation and refocusing. Throughout this description, the excitation pulse may sometimes be referred to as a chirp pulse. This is intended to be illustrative of a suitable embodiment of excitation pulse and is not intended to be limiting. For example, in some embodiments, a hyperbolic secant pulse may be used as the excitation pulse.

In one embodiment, the pulse sequence comprises an excitation pulse followed by one or more, for example two, refocusing pulses. In various embodiments, the excitation pulse may be a chirp pulse. The excitation pulse excites magnetization sequentially along one spatial axis. The excitation pulse may have varied frequency, varied gradient, or both. The refocusing pulses create $T_2$ weighting. A first refocusing pulse reorders the signal, for example by flipping the signal 180°, creating local spin echoes, such that the signal progresses in the opposite direction. A second refocusing pulse again reorders the signal, for example by flipping the signal 180°, such that the signal progresses in the original direction. Thus, after the second refocusing pulse, the local spin echoes progress in the direction of the excitation pulse.

The local spin echoes are acquired after the excitation pulse; the local spin echoes are acquired at progressing times and reflect the signal at different points in the excitation pulse because the excitation pulse moves in time. The signals produced thus may then be read out sequentially in time. In multislice embodiments of RASER, a phase-encoding gradient along a second spatial axis may be used to generate more complete image data. By producing a train of locally refocused spin echoes, RASER avoids many of the image artifacts common to techniques based on rapid gradient reversal to form echoes, like EPI.

Figure 1:
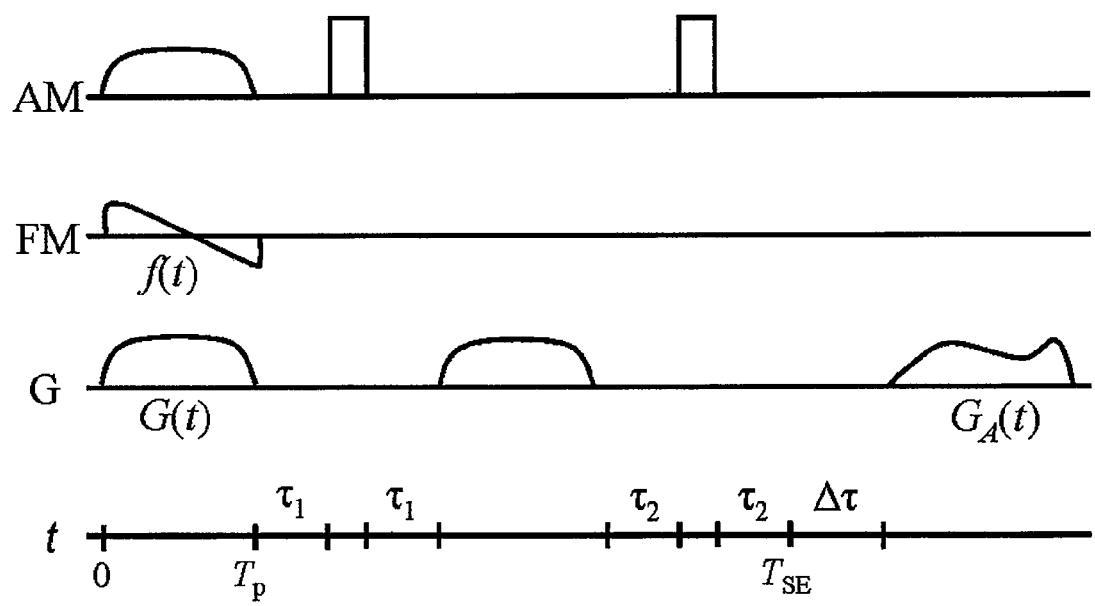
FIG. 1 illustrates a pulse sequence in accordance with one embodiment.

FIG. 1 illustrates a pulse sequence in accordance with one embodiment. As shown, the excitation pulse begins at time, t=0 and ends at time t=$T_p$. The excitation pulse occurs during an excitation gradient. The excitation pulse has a frequency modulation function, $f(t)$, and an excitation gradient modulation function, $G(t)$, which has an integrated area, $$A = \int_0^{T_p} G(t)\,dt \quad \text{(Eq. 1)}$$

The isochromats in the object will be excited sequentially according to the function $$x_E(t) = f(t)/\gamma G(t) \quad \text{(Eq. 2)}$$

where $x_E(t)$ is the position that is excited at a given time, and $\gamma$ is the gyromagnetic ratio. The inverse of this function, $x_E^{-1}(t) = T_E(x)$ gives the time of excitation for a given position.

After excitation there is a delay, $\tau_1$, followed by a first refocusing pulse, which is, in turn, followed by another delay, $\tau_1$. The first refocusing pulse may be in any form. Then a second time-encoding gradient, the refocusing gradient, of area equal to the area of the excitation gradient, A, is performed. Then there is a delay, $\tau_2$, a second refocusing pulse, and another delay, $\tau_2$. At this time, $T_{SE}$, the isochromat that was excited first will have its local spin echo. The isochromats in the object sequentially experience local spin echoes in the same progression as excitation, so that $$x_{SE}(t) = x_E(t - T_{SE}) \quad \text{(Eq. x)}$$

where $x_{SE}(t)$ is the position in the object that is having a local spin echo. The local spin echoes last for a duration equal to $T_p$.

The isochromats in the object are thus excited at different times. As a result, the isochromats experience differing amounts of evolution during the excitation pulse. This creates a phase profile across the object that localizes any signal acquired to the position of the vertex of the profile. At the end of the second refocusing pulse a given isochromat has experienced a gradient area, relative to the excitation gradient, during the excitation pulse equal to:

$$\int_{T_E(x)}^{T_p} G(t)\,dt \quad \text{(Eq. 3)}$$

and has experienced a gradient area (of the refocusing gradient) equal to A between the first and second refocusing pulses. Therefore the total gradient area experienced is:

$$\int_{T_E(x)}^{T_p} G(t)\,dt - \int_0^{T_p} G(t)\,dt = -\int_0^{T_E(x)} G(t)\,dt \quad \text{(Eq. 4)}$$

where the first gradient refers to the excitation gradient, the second gradient refers to refocusing gradient and the sum is equal to the net effect of the excitation gradient and the refocusing gradient. The gradient area needed to rephase an isochromat at a given position is:

$$A_R(x) = \int_0^{T_E(x)} G(t)\,dt \quad \text{(Eq. 5)}$$

At time $T_{SE}+\Delta\tau$, a gradient with a shape given by $G_A(t)$, not necessarily equal to G(t), is turned on where $G_A$ refers to the acquisition gradient and G(t) refers to the excitation gradient. At a given time, the area of the acquisition gradient is:

$$A_A(t) = \int_{T_{acq}+\Delta\tau}^{t} G_A(t)\,dt \quad \text{(Eq. 6)}$$

When $A_A(t_0)=A_R(x_0)$, the vertex of the profile is at position $x_0$ at time $t_0$. In order for that position to be the same position that is experiencing a local spin echo, and therefore to eliminate $T_2^*$ weighting, $x_0$ must equal $x_{SE}(t_0)$. This can most easily be accomplished by making $\Delta\tau=0$, and $G_A(t)=G(t)$.

In one embodiment, RASER uses only three RF pulses, the excitation pulse and first and second refocusing pulses, for any number of echoes, while the excitation gradient (or time-encoding gradient, $G_{te}$) remains constant during the excitation pulse. In addition, in some embodiments, each locally refocused echo has effectively the same TE, because the echoes are formed by a pair of 180° pulses (i.e., a double spin-echo). The echoes in RASER may be uniformly $T_2$-weighted because the local refocusing plane and the vertex plane coincide and move in concert during $T_{acq}$.

Using the RASER method, magnetization may be sequentially refocused in a manner that effectively creates a series of local spin echoes with a constant echo time. RASER thus is free from susceptibility artifacts and relaxation-related blurring due to $T_2$ (or $T_2^*$) decay, because the acquisition takes place at the same effective TE. In some applications, it may be useful to retain $T_2$ weighting. For example, to increase the BOLD effect in fMRI studies. Thus, in some embodiments $T_2^*$ weighting may be added back in.

If $T_2^*$ weighting is desired, it can be added by making $x_0$ not equal to $x_{SE}(t_0)$. In this way, the position where the signal is originating is not having a local spin echo. This can be implemented most easily by making $\Delta\tau$ greater than zero while $G_A(t)=G(t)$. In this case there will be $T_2^*$ weighting equal to $e^{-\Delta\tau/T_2^*}$.

In some embodiments, RASER uses the quadratic phase produced by a frequency-swept chirp pulse to time-encode one dimension of the image. It is noted that in embodiments wherein a non-chirp excitation is used, the phase profile is approximately quadratic. After the excitation pulse, the phase of the magnetization ($\phi$) has a quadratic dependence on position [x] in the direction of the excitation gradient ($G_{re}$). Following excitation, the combination of gradients (including at least the excitation gradient and the acquisition gradient) and 180° pulses (for example, first and second refocusing pulses) preserves the quadratic phase profile. In other words, when the acquisition period begins, the vertex of the quadratic phase is at the edge of the slab that was excited first. At the vertex of the quadratic phase function, $d\phi/dx=0$; therefore, only isochromats on opposite sides of a plane defined by the vertex will have similar phase. Continued application of the acquisition time-encoding gradient moves the vertex across the slab so that the signal originates from sequential planar locations as the acquisition proceeds. After the acquisition period ($T_{acq}$) has lasted for a period equal to $T_p$, the vertex of the quadratic phase reaches the edge of the slab that was excited last. During the acquisition period ($T_{acq}$), signal localization is accomplished in the time-encoded direction by acquiring at sequential time points (i.e., it is not necessary to perform Fourier transformation).

RASER uses the time dependence of each local spin echo to do localization of the local spin echo. More specifically, the spins are not in the same phase because the excitation pulse may be modulated, for example frequency-modulated. This property may be used to localize the local spin echoes without Fourier transformation. RASER produces high quality single-shot images that can be used for a wide range of applications.

In some embodiments, an excitation pulse may be used to excite multiple slices. Phase-encoding and frequency-encoding may be performed in the other two dimensions.

While the RASER method is described specifically with respect to 2D images, it may further be used for 3D imaging. For example, using an excitation pulse having a constant frequency and a modulated gradient results in a spiral excitation that may be used to produce a 3D image. Alternative manners of using the RASER method to obtain 3D images may further be used.

Figure 2A:
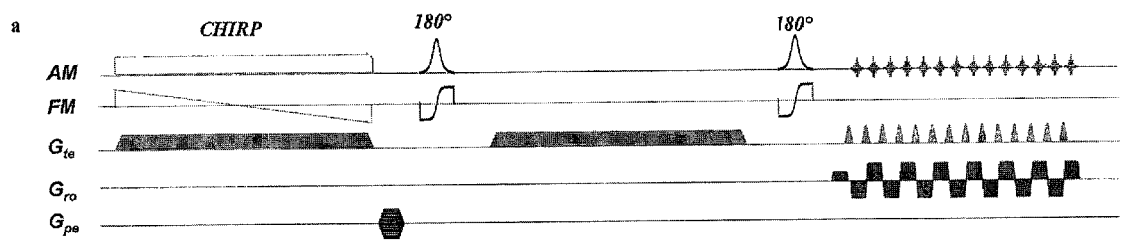
FIG. 2a illustrates a pulse sequence with a blipped acquisition gradient in accordance with one embodiment.
Figure 2B:
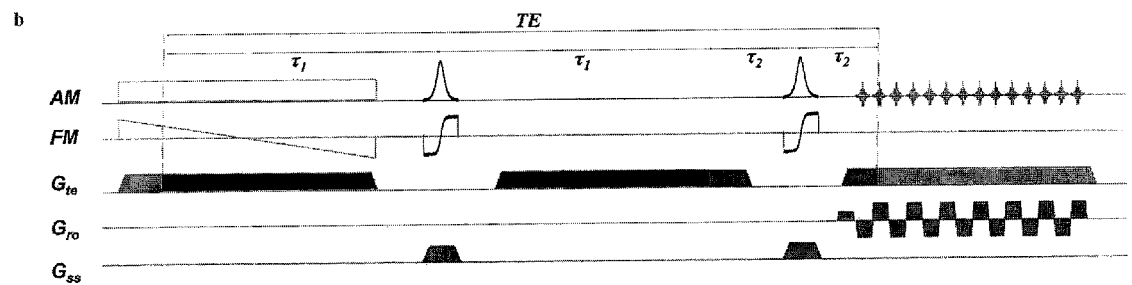
FIG. 2b illustrates a pulse sequence with a continuous acquisition gradient in accordance with one embodiment.
Figure 2C:
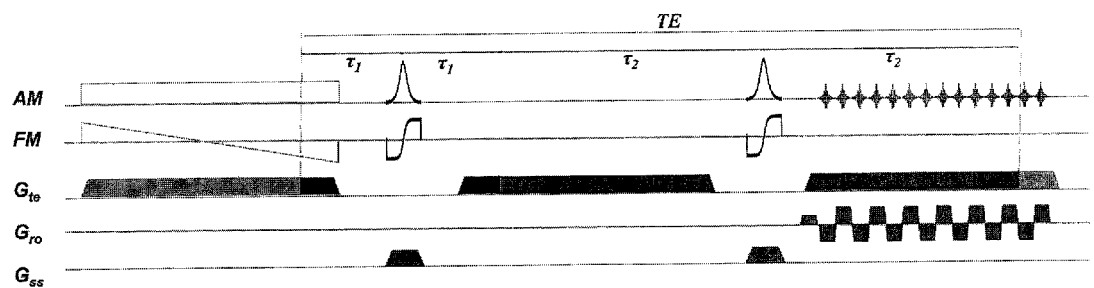
FIG. 2c illustrates a pulse sequence with a continuous acquisition gradient in accordance with another embodiment.

FIGS. 2a, 2b, and 2c illustrate embodiments of RASER pulse sequences. FIG. 2a illustrates a pulse sequence suitable for multislice MRI wherein the gradient is blipped in the acquisition window, discussed more fully below. FIGS. 2b and 2c illustrate a pulse sequence suitable for a single-shot MRI and show balancing of the timing and gradient with a continuous gradient in the acquisition window. In each of FIGS. 2a-2c, TE is the same for both isochromats. In the embodiments shown, the excitation pulse is a 90° chirp pulse the 180° refocusing pulses are adiabatic full passages. In alternative embodiments, other pulses may be used. For example, the excitation pulse may comprise a hyperbolic secant pulse.

As shown, spin excitation is performed with a long 90° chirp pulse that is applied in the presence of a field gradient. This field gradient may be referred to as a time-encoding gradient. In the embodiment shown, the chirp excitation pulse is frequency-modulated. The frequency-modulated chirp pulse sequentially excites the spins along the time-encoded direction by sweeping the pulse frequency through each resonance. The excitation pulse produces a 90° rotation for all magnetization in a slab having a thickness $\Delta x$ equal to $2\pi b_w/\gamma$ Gte, where $b_w$ is the bandwidth of the pulse (in Hz) and $\gamma$ is the gyromagnetic ratio. The chirp pulse thus comprises a linear sweep, spreading the echoes linearly in time. Once excited, an isochromat precesses in the transverse plane for the rest of the excitation pulse. In this way each isochromat experiences a different amount of dephasing due to the presence of the time-encoding gradient. More specifically, the transverse phase of each isochromat created by the presence of the time-encoding gradient evolves a different amount. One or more additional pulses may be used to reverse this phase evolution in a sequential manner during the acquisition period. In one embodiment, two refocusing pulses are used.

A series of gradients are used during the pulse sequence. As described, the excitation pulse may be done in the presence of a first time-encoding gradient: the excitation gradient. The shape of the excitation gradient is constrained by the excitation pulse. For chirp and hyperbolic secant pulses, the gradient is constant (i.e., not blipped). With other excitation pulses, the shape of the excitation gradient may vary. A second time-encoding gradient, the refocusing gradient, is placed followed by the second refocusing pulse. The refocusing gradient is thus placed between the first refocusing pulse and the second refocusing pulse. During the acquisition window a third time-encoding gradient, the acquisition gradient, is placed. As is described below, the acquisition gradient can be either a series of blipped gradients turned on between readouts as shown in FIG. 2a, or a continuous gradient as shown in FIGS. 2b and 2c. Generally, the refocusing gradient and the acquisition gradient may be of any shape such that the area of the respective gradient is equal to the area of the other time-encoding gradients. Thus, the length of the acquisition gradient, whether the length of a single continuous gradient or the cumulative length of blipped gradients sums to zero with the other time-encoding gradients (the excitation gradient and the refocusing gradient) for sequential points in space, for example as shown in FIGS. 2b and 2c.

The total areas for the time-encoding gradients (for example, first, second, and third time-encoding gradients) sum to zero for a specific point in space at a specific time. The gradient area in the time-encoding direction sum to zero for the isochromats that are having their local rephasing time at the time of acquisition. The local rephasing time may be referred to as the local spin echo. When using a continuous acquisition gradient, this may be done by providing all gradients in the time-encoding direction (for example, three gradients: an excitation gradient, a refocusing gradient, and an acquisition gradient) with the same amplitude and duration. If the gradients are blipped, the blipped gradient areas may be calculated to produce the same effect.

As is known in the art, an alternating gradient in the frequency encoded direction may be turned on while the signal is read out. This gradient is in a different direction than the time encoding gradients (including the excitation gradient, the refocusing gradient, and the acquisition gradient). Most specifically, the alternating gradient is in a different direction than the acquisition gradient. Typically, the alternating gradient is orthogonal to the acquisition gradient. As previously described, the acquisition gradient (or third time-encoding gradient) sequentially rephases magnetization along one dimension. While that is occurring, the alternating gradient gets traditional readout projections in the second dimension. Thus, while the acquisition gradient is on, or between its blips in embodiments where it is blipped, there is an alternating gradient in another direction which gets projections of the object for sequential lines in space. Thus, using a composite of the acquisition gradient and the alternating gradient, a 2-D image may be acquired. Both multislice and single-shot embodiments of RASER can use continuous or blipped time-encoding gradients during the acquisition window. In a multislice experiment the time-encoding direction is through-plane, while in a single-shot experiment the time-encoding direction is in-plane.

The acquisition window begins at the local rephasing time, or local spin echo, of the first excited isochromat and ends at the local rephasing time, or local spin echo, of the last excited isochromat. The local rephasing time is the time at which the variations in magnetic susceptibility, static field homogeneity, and other frequency shifts are refocused at that particular point in space. The local rephasing time is analogous to a spin echo and follows the same timing rules, and thus may be referred to as the local spin echo. During the acquisition window, a time-encoding gradient, (the acquisition gradient) rephases the isochromats sequentially. The signal in each acquisition period is dominated by the isochromats that have experienced gradient areas summing to zero. The refocusing pulses (for example, first and second refocusing pulses) rephase the isochromats in the same order that they were excited, causing all local spin echoes to have the same TE value.

Referring to FIG. 2a, a pulse sequence embodiment suitable for multislice MRI is shown. FIGS. 2b and 2c illustrate pulse sequence embodiments for single-shot MRI. It is noted that, using a multislice embodiment, the third direction is defined with phase encoding. In the embodiment shown, spin excitation is performed with a chirp pulse that is applied in the presence of a time-encoding field gradient, the excitation gradient. For multislice MRI, a phase encoding gradient may be placed after excitation. In single-shot MRI embodiments, a phase-encoding gradient may not be used. The first refocusing pulse, for example a 180° pulse, is placed after the phase encoding gradient. The excitation gradient and first refocusing pulse order the spins sequentially opposite the excitation pulse. Next, a time-encoding gradient of equal amplitude and duration to the excitation gradient is turned on. This gradient may be referred to as the refocusing gradient. A second 180° pulse is turned on and refocuses the isochromats again to match the sequence of the excitation pulse. The second 180° pulse may be referred to as the second refocusing pulse. The refocusing gradient between two normal 180° pulses (the first and second refocusing pulses) thus reorders the spins so they can be read out in the same order as they were excited.

As previously discussed, the acquisition window begins at the local rephasing time or local spin echo of the first isochromat excited and ends at the local rephasing time or local spin echo of the last isochromat excited. During the acquisition window a gradient in the time-encoding direction, the acquisition gradient, rephases the isochromats sequentially. The acquisition gradient and/or the refocusing gradient gradient, whether for multislice MRI or single-shot MRI, may each comprise either a series of blipped gradients turned on between readouts (for example, the acquisition gradient shown in FIG. 2a), or a continuous gradient (for example, the acquisition gradient shown in FIGS. 2b and 2c).

As shown in FIGS. 2b and 2c, pulse sequence embodiments suitable for single-shot MRI substantially emulate the pulse sequence for a multislice MRI shown in FIG. 2a but have no phase encode gradients and have slice selection gradients during the 180° pulses. Single-shot sequences having continuous time-encoding gradients during readout are depicted for two different isochromats in FIGS. 1b and 1c. Single-shot pulse sequences may include slice selection gradients that act as limiting gradients to obtain a 2D image.

Thus, in the embodiments shown, a chirp excitation pulse is applied in the presence of a time-encoding gradient, the excitation gradient. A first slice selection gradient is done concurrently with a first refocusing pulse. A further time-encoding gradient, the refocusing gradient, is placed after the first refocusing pulse. A second slice selection gradient is done concurrently with a second refocusing pulse after the refocusing gradient. Acquisition is done in the presence of a third time-encoding gradient, the acquisition gradient. While FIGS. 2b and 2c illustrate a continuous acquisition gradient, the acquisition gradient may alternatively be a blipped gradient, such as shown in FIG. 2a.

Another way to conceptualize the action of this pulse sequence is to consider the phase profile across the selected slab. The chirp excitation pulse creates a phase profile that is a quadratic function of position along the direction of the time-encoding gradient. As noted, other excitation pulses may create a phase profile that is approximately a quadratic function of position along the direction of the time-encoding gradient. At the vertex of the quadratic phase profile, the derivative of the magnetization phase is zero. Hence, only isochromats near the vertex have similar phase, and data acquired from the slab will be dominated by isochromats near the vertex of this quadratic phase profile. The steepness of this profile, and therefore the localizing affect of the profile, is determined by the product of the pulse bandwidth ($b_w$) and its length ($T_p$). This product may be referred to as the R value. This profile is preserved throughout the refocusing 180° pulses (for example, first and second refocusing pulses) by the time-encoding gradient, the refocusing gradient, between them. When the acquisition window begins, the vertex of the quadratic phase is at the edge of the slab that was excited first. Continued application of the acquisition gradient moves the vertex across the slab while the local spin echoes are acquired, so the signal originates in sequential locations as the acquisition proceeds. The timing is such that the isochromats near the vertex are the same isochromats having their local spin echo, so the signal is originating from a small set of isochromats that have had their variations in magnetic susceptibility, static field homogeneity, and other frequency shifts, refocused.

The quadratic phase profile produced across a slab excited by a chirp pulse was analytically described by Pipe. Pipe, J. G., *Spatial Encoding and Reconstruction in MRI with Quadratic Phas Profiles*. Magn Reson Med, 1995. 33: p. 24-33. The quadratic phase across the slab is:

$$\Phi(x)=\pi R(-x^2+2x-4\tau x)/4. \qquad (\text{Eq. 7})$$

Figure 3:
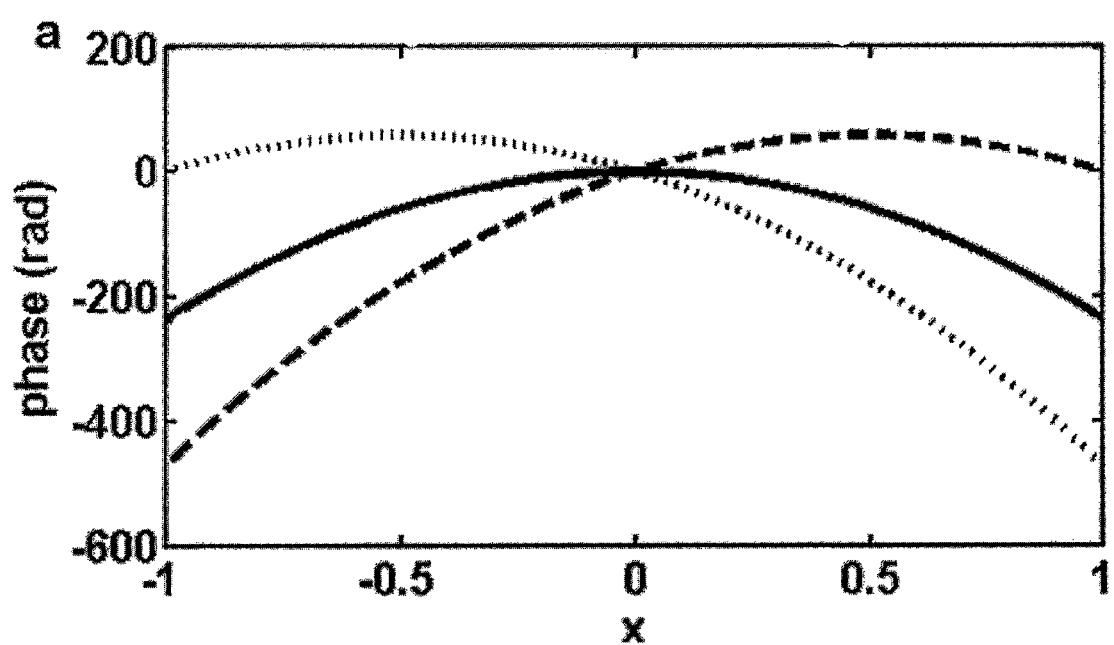
FIG. 3a illustrates the phase profile as a function of the normalized position variable x is shown at three different normalized times, $\tau=0.25, 0.5, 0.75$, in accordance with one embodiment.

In this derivation, x is the position along the slab normalized to the slab thickness, and τ is the fraction of the time-encoding gradient that has been balanced in the acquisition period. The values for x range from −1 to 1, and the values for τ range from 0 to 1. The steepness of the phase profile depends only on R once the slab thickness is normalized out of the equation. FIG. 3a illustrates the phase profile as a function of the normalized position variable x at three different normalized times, τ=0.25 (dotted line), 0.5 (solid line), and 0.75 (dashed line) with R=300 are shown in FIG. 3a. As shown, the acquisition gradient in the time-encoding direction changes τ, thereby shifting the vertex. In the blipped version of RASER (for example, as shown in FIG. 2a), the vertex is stationary during the readout, and is shifted between the readouts. In the continuous gradient version of RASER (for example, as shown in FIGS. 2b and 2c), the vertex is continuously moving.

Figure 4A:
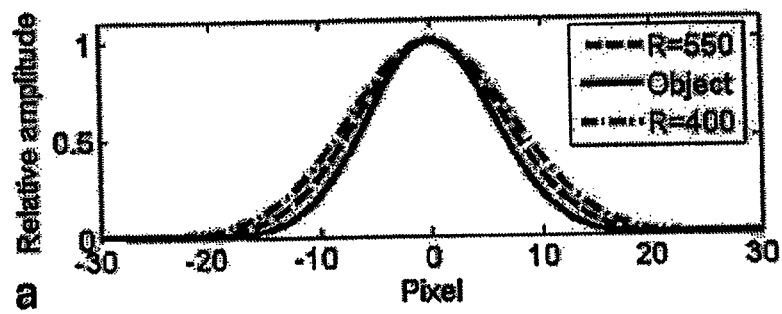
FIG. 4a illustrates a 1D object and simulated time-encoded images in accordance with one embodiment.
Figure 4B:
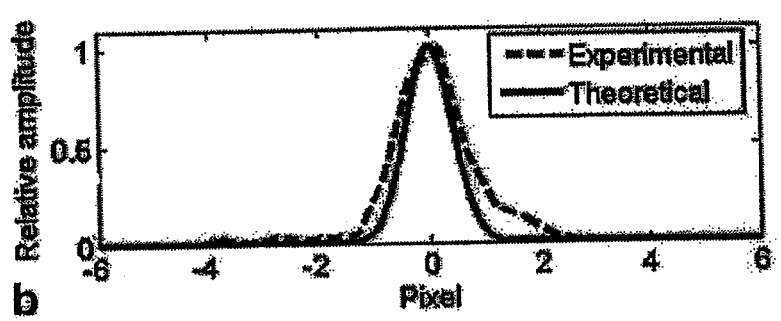
FIG. 4b illustrates the theoretical and experimental point spread function in the time-encoded direction in accordance with one embodiment.
Figure 4C:
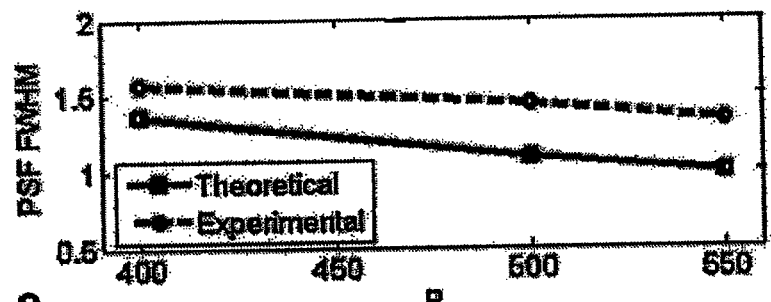
FIG. 4c illustrates the FWHM of the theoretical point spread function and the FWHM of the Gaussian fit to the experimental point spread function.

The point spread function (PSF) in the time-encoded direction may be estimated using numerical simulations. For the simulation the relative transverse magnetization ($M_{xy}$) in a time-encoding of a 1D Gaussian-shaped object can be calculated using Bloch equations. The 1D image of the object may be generated from the set of $M_{xy}$ values sampled during $T_{acq}$ ($N_{te}$=256). FIGS. 4a-4c show an object imaged as described. FIG. 4a shows the object, as well as time-encoded 1D images of the object, using two different R values. A better representation of the object, due to higher resolution, is obtained with the larger R value. The PSF may be calculated from the time-encoded image using the convolution theorem:

$$P(\omega)=S(\omega)/H(\omega) \tag{Eq. 8}$$

where $P(\omega)$, $S(\omega)$, and $H(\omega)$ are FTs of the PSF, image, and object respectively, and $\omega$ is the frequency variable.

As shown in FIG. 4b, the numerically determined PSF is a smooth function. Furthermore, the width of the PSF in terms of the normalized spatial coordinate $\xi$ depends only on the value of R. To obtain an approximate R dependence for the normalized PSF width, a least-square fitting of the numerically determined PSF may be performed. In the embodiment of FIG. 4b, this yields:

$$\Delta\epsilon_{PSF}=17.0/R+0.00039 \tag{Eq. 9}$$

where $\Delta\xi_{PSF}$ is the full-width at half-maximum (FWHM) of the normalized PSF. Hence, in multislice RASER a given slice thickness can be obtained using:

$$R=17.0/(thk/\Delta x)-0.00039 \tag{Eq. 10}$$

where thk is the desired slide thickness (FWHM). Likewise, the R value needed to achieve a given in-plane spatial resolution ($N_{te}=1/\Delta\xi_{PSF}$) in a single-shot RASER experiment may be estimated using:

$$R=17.5(N_{te}-0.55) \tag{Eq. 11}$$

For 32 contiguous pixels, R is 550.

In the embodiments shown, the quadratic phase profile across the time-encoded direction is a function of the chirp pulse R value, a variable which is specified at the time the frequency-swept pulse is generated. In a multislice embodiment of RASER, R is the sole determinant of the thickness of the slice profile as a fraction of the slab thickness. The number of slices acquired does not affect the thickness of individual slices. One feature of RASER is the ability to vary the spacing of the slices when a blipped acquisition gradient is used. For example, the slices may be highly spaced, contiguous, or overlapped. Using a continuous acquisition gradient, the slices are contiguous. The use of overlapped slices might offer a means to avoid the loss of small objects, such as Alzheimer's disease plaques, to partial volume effects. If the slices are overlapped, there is an increased likelihood that a given plaque will fall completely within a slice.

The RASER sequence acquires multiple local spin echoes per excitation where all of the local spin echoes are $T_2$ weighted, and all of the local spin echoes have the same echo time. Thus, referring to FIGS. 2b and 2c, TE is the same regardless of the point on the excitation pulse selected. This results in a fast image that is substantially free of susceptibility and ghosting artifacts and avoids resolution degradation. The multiple local spin echoes can be used to produce a 2D multislice image set or may be used to create a single shot image with a total acquisition time on the order of 100 ms. Unlike an interleaved multislice sequence, the multislice version of RASER acquires all slices while depositing the same RF energy (specific absorption rate SAR) of a single slice, which may be advantageous in situations where SAR is a limiting factor for the total acquisition time. Bloch simulations may be used to estimate the relative SAR of sequences using the same repetition time (TR).

It is also postulated that single-shot RASER will have a greater insensitivity to motion than other single-shot imaging methods since each echo is Fourier transformed independently from the others. This substantially prevents any motion during an echo from propagating throughout the image.

Continuous-gradient embodiments, specifically, continuous acquisition gradient embodiments of RASER are generally less demanding of the gradient coils than blipped embodiments of RASER. In addition, continuous-gradient embodiments do not require time between readouts. However, continuous-gradient embodiments have additional post-processing.

Post processing for a continuous-gradient embodiment of RASER comprises removing the linear phase shift that occurs in the readout direction prior to Fourier transforming the echo. This may be accomplished by subtracting the phase shift due to the time-encoding gradient from each point acquired. The phase shift is given by:

$$\Delta\Psi=-2\pi\gamma G_{te}\Delta x n_{ro}sw^{-1}(n_{te}/N_{te}-x_c/\Delta x-0.5) \tag{Eq. 12}$$

where $\Delta_x$ is the slab thickness, $x_c$ is the center position of the slab excited by the chirp pulse, $n_{ro}$ is an integer index representing a given point in the read-out direction, $n_{te}$ is an integer index representing the current point in the time-encoded direction, $N_{te}$ is the total number of points in the time-encoded direction, and sw is the bandwidth of the frequency-encoding.

Data may be acquired during the ramp times of the readout gradients (the alternating gradient previously discussed) to increase the resolution of the single-shot image or the number of slices in a multislice image. If this is done in the continuous-gradient version of RASER, data is acquired continuously throughout the acquisition window, which is generally the most efficient use of time possible.

RASER is relatively simple to implement on existing equipment, and it may provide an improvement over existing single-shot imaging methods for functional imaging. The advantages of RASER over EPI include true $T_2$ weighting for all echoes, no susceptibility artifacts, no Nyquist ghosts, and no blurring from $T_2$ decay between the echoes. The fact that all echoes are $T_2$-weighted echoes, as opposed to the echoes being $T_2^*$-weighted, means that RASER is increasingly advantageous as the field strength increases. Further, when desired and as previously described, $T_2^*$-weighted may be added in.

EXAMPLES

The RASER imaging sequence is presented along with single-shot and multislice images, and is compared to single spin echo and gradient echo sequences.

All experiments were performed with a 4T, 90-cm magnet (model 4T-900, Oxford Magnet Technology, Oxfordshire, UK), a clinical gradient system (model Sonata, Siemens, Erlangen, Germany), and an imaging spectrometer (model Unity Inova, Varian, Palo Alto, Calif.) with 16 bit ADCs. Images of phantoms and normal human brain were acquired using a TEM head coil. Human studies were performed according to procedures approved by the Institutional Review Board of the University of Minnesota Medical School, after obtaining informed written consent.

Multislice RASER images were acquired with an in-plane matrix of 128×128 in the frequency and phase encoded directions, while the through-plane direction was time-encoded with 8 slices. Using the approximation described above, the slice thickness (thk) was estimated to be 3 mm. The images were acquired with TE=80 ms, and the total acquisition time ($T_{acq}$) was 4 min 17 s. The readout bandwidth (sw) was 100 kHz. The field-of-view (FOV) was 20 cm in the frequency-encoding direction, 20 cm in the phase-encoding direction, and 8 cm in the time-encoding direction. The chirp pulse was performed with BW=23.3 kHz and $T_p$=30 ms. Comparison multislice images were acquired with the standard spin-echo multislice sequence (SEMS) by Varian, Inc. As many parameters as possible were held constant between the RASER and SEMS experiments.

Single-shot images of a human brain using the blipped-gradient version of RASER were acquired with the following parameters: matrix=64×32, TE=80 ms, $T_{acq}$=110 ms, sw=90 kHz, thk=7 mm, FOV=20 cm×20 cm, BW=10 kHz, $T_p$=30 ms. Single-shot images of a water-filled resolution phantom were acquired using the blipped-gradient version of RASER and the following parameters: matrix=64×64, TE=130 ms, $T_{acq}$=190 ms, sw=100 kHz, thk=5 mm, FOV=25 cm×25 cm, BW=11.7 kHz, and $T_p$=60 ms. Comparison images were acquired using a single gradient-echo sequence from Varian, Inc. (GEMS). They were acquired with as many of the same parameters of the RASER images as possible. The echo times were kept less than 30 ms.

Single-shot images of a saline phantom were acquired using the continuous-gradient version of RASER with the following parameters: matrix=64×48, TE=96 ms, $T_{acq}$=136 ms, sw=150 kHz, thk=5 mm, FOV=20 cm×20 cm, BW=17.5 kHz, and $T_p$=40 ms. A single-shot image with the number of experiments ($N_{ex}$) equal to one, a single shot image with $N_{ex}$=48, and a SEMS image with the same parameters were acquired to compare SNR. The repetition time for the averaged RASER image and the SEMS image was 8 s to minimize $T_1$ effects. The total acquisition time for the averaged RASER image and the SEMS image were both 6 min 24 s.

Single-shot images of a water-filled resolution phantom were acquired using the continuous-gradient version of RASER with the following parameters: matrix=128×56, TE=143 ms, $T_{acq}$=203 ms, sw=175 kHz, thk=5 mm, FOV=25 cm×7 cm, BW=11.7 kHz, $T_p$=60 ms, and $N_{ex}$=9. Single-shot images of a human brain were acquired using the continuous-gradient version of RASER with the following parameters: matrix=128×48, TE=140 ms, $T_{acq}$=200 ms, sw=140 kHz, thk=2 cm, FOV=20 cm×10 cm, BW=23.3 kHz, $T_p$=30 ms. Single-shot images were zero-filled in the frequency encoded direction to twice the matrix size.

Results

Multislice 2-D Images

Figures 5A, 5B, 5C, 5D:
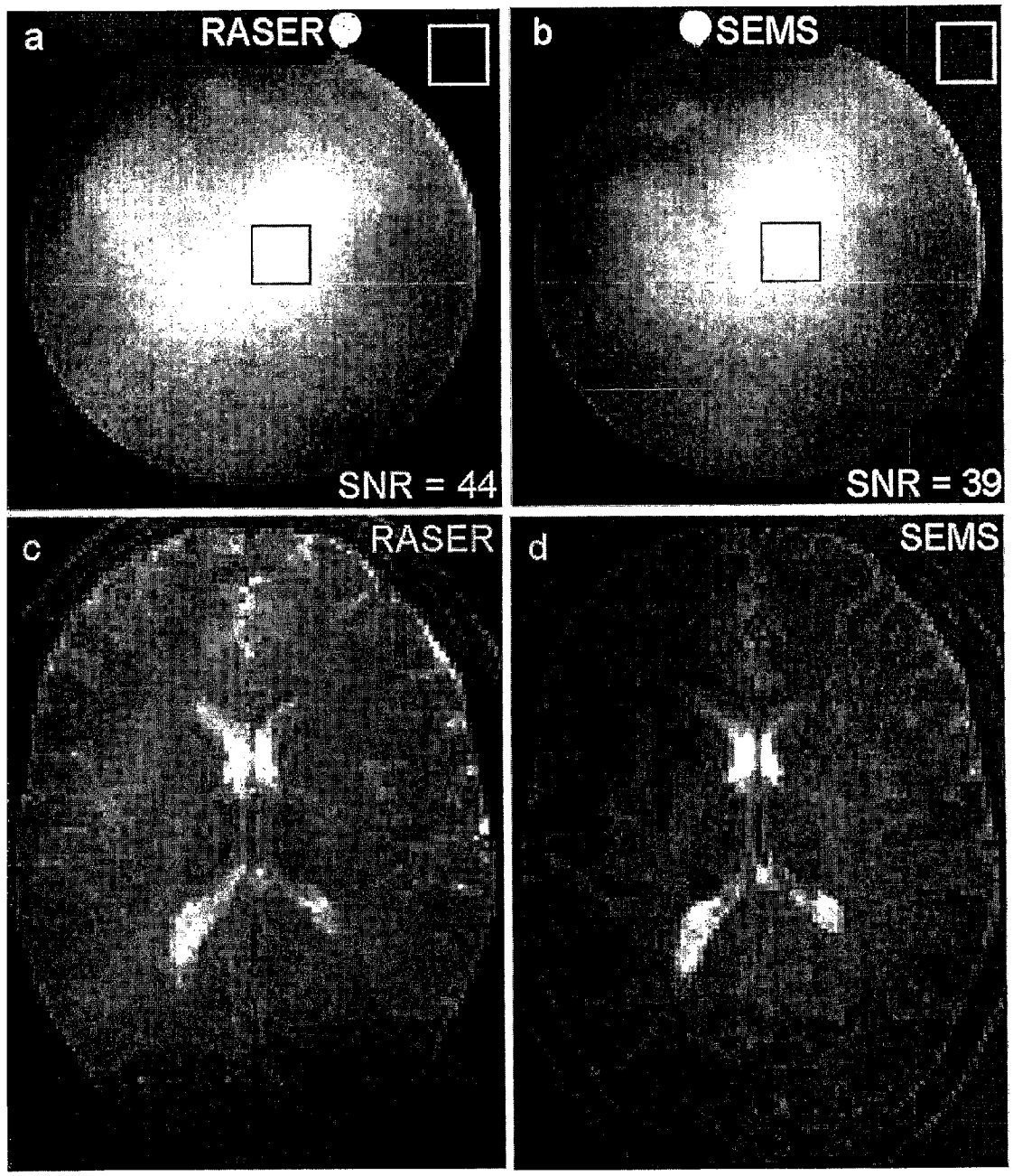
FIG. 5a illustrates an image of a saline phantom acquired with RASER, in accordance with one embodiment.
FIG. 5b illustrates an image of a saline phantom acquired with a standard spin-echo sequence (SEMS).
FIG. 5c illustrates an image of a human brain acquired with RASER, in accordance with one embodiment.
FIG. 5d illustrates an image of a human brain acquired with a standard spin-echo sequence (SEMS).

FIGS. 5a-5d illustrate multislice 2-D images. FIGS. 5a and 5b illustrate images of a saline phantom acquired with RASER and a standard spin-echo sequence (SEMS) respectively. FIGS. 5c and 5d illustrate images of a human brain acquired with RASER and SEMS respectively. Constant scaling factors were used for displaying image pairs. The images show that the quadratic phase has a localizing effect that can be used for multislice imaging. All images were acquired with TE=80 ms, and the total acquisition time ($T_{acq}$) was 4 min 17 s. The readout bandwidth (sw) was 100 kHz. The field-of-view (FOV) was 20 cm in the frequency-encoding direction, 20 cm in the phase-encoding direction, and 8 cm in the time-encoding direction. The chirp pulse was performed with BW=23.3 kHz and $T_p$=30 ms.

FIG. 5a shows a representative image of the saline phantom acquired with the multislice RASER sequence, and FIG. 5b shows the same slice acquired with the SEMS sequence. The SNR of the RASER image was 44, and the SNR of the SEMS image was 39. The difference between the appearance of the images and the SNR are believed to reflect the different sensitivities of the two sequences to RF field inhomogeneity. In RASER, the 180° flips were accomplished with an adiabatic pulse (specifically, the hyperbolic secant pulse (9), whereas SEMS used amplitude-modulated pulses.

Human brain images from RASER and SEMS acquisitions are shown in FIGS. 5c and 5d, respectively. It can be seen that the contrast in the RASER image is predominately $T_2$, and there are no ghosting or susceptibility artifacts. The image quality and contrast are comparable to the standard single-echo image despite the fact that all slices in RASER are produced with one excitation pulse. The darkness at the bottom of each image is attributed to poor coil sensitivity at the bottom of the coil.

Single-Shot Images

Figures 6A, 6B, 6C, 6D:
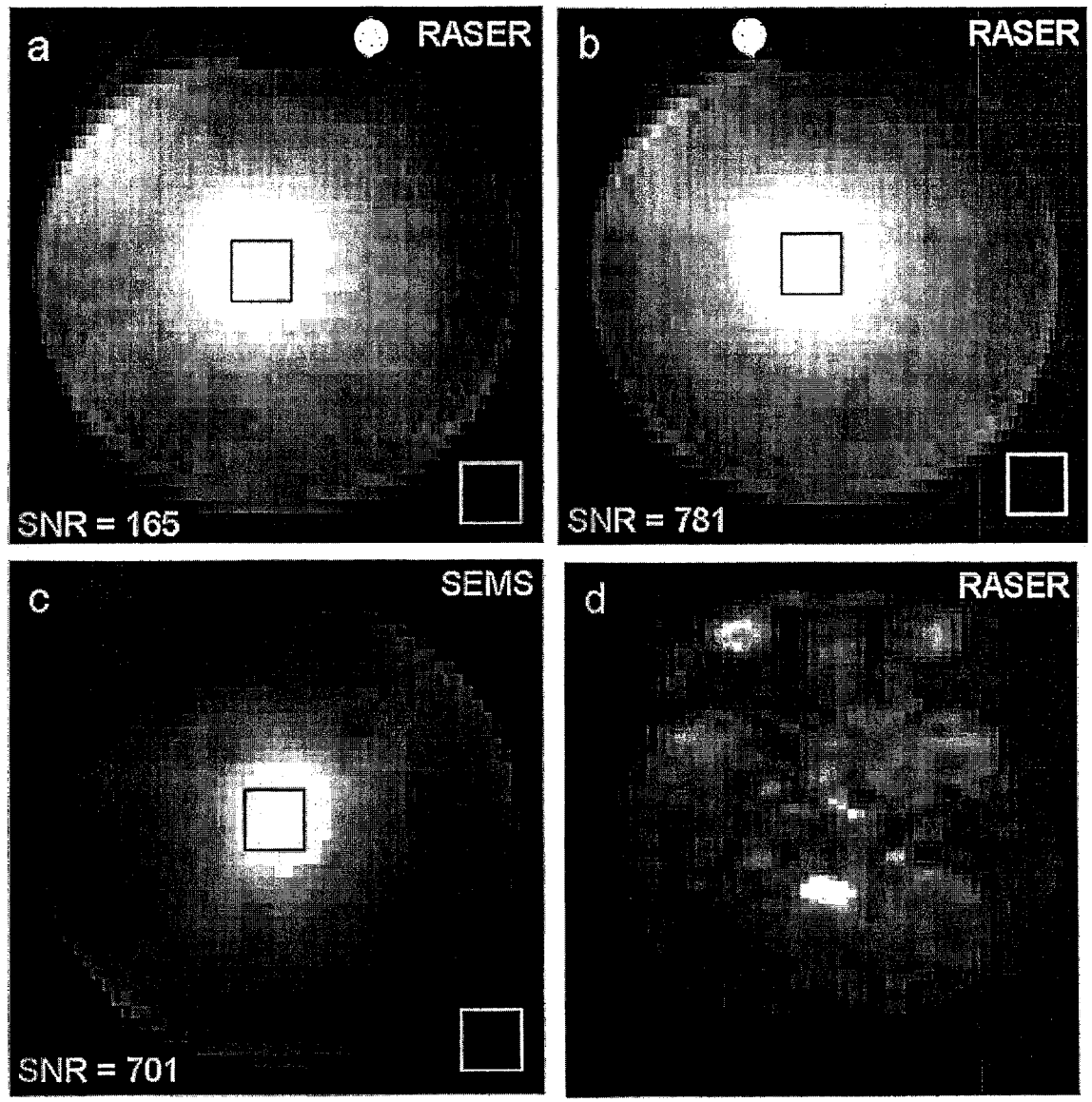
FIG. 6a illustrates an image acquired with single-shot RASER with no signal averaging, in accordance with one embodiment.
FIG. 6b illustrates an image acquired with single-shot RASER with 48 signal averages, in accordance with one embodiment.
FIG. 6c illustrates an image acquired with SEMS with 48 phase encodes.
FIG. 6d illustrates an image of a human brain acquired with single-shot RASER, in accordance with one embodiment.

FIGS. 6a-6d illustrate single shot images. FIG. 6a illustrates a single shot RASER image of a saline phantom with no signal averaging. FIG. 6b illustrates a single shot RASER image of a saline phantom with 48 signal averages. FIG. 6c illustrates an single shot SEMS image of the same slice with 48 phase encodes. FIG. 46 illustrates a single shot RASER image of a human brain.

FIGS. 6a and 6b show a single-shot image of a saline phantom with $N_{ex}$=1 and 48, respectively. FIG. 6c shows an image of the same phantom using a SEMS sequence. The averaged RASER image and the SEMS image have approximately the same SNR for the same imaging time. FIG. 6d shows an image of the brain of a healthy volunteer acquired in a single shot. This $T_2$-weighted image appears free of the susceptibility and ghosting artifacts that limit traditional single-shot imaging techniques such as EPI. This brain image was acquired from a slice at the level of the eyes where susceptibility artifacts can produce significant image distortion and signal dropout. Processing the blipped-gradient version of RASER consists of taking the Fourier transform in the readout direction only.

Figure 7A:
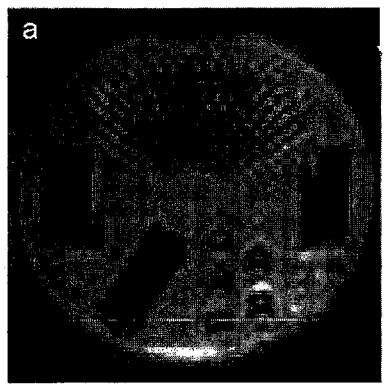
FIG. 7a illustrates an image of a resolution phantom acquired using single shot RASER with TE=143 ms, with zero filling, in accordance with one embodiment.
Figure 7B:
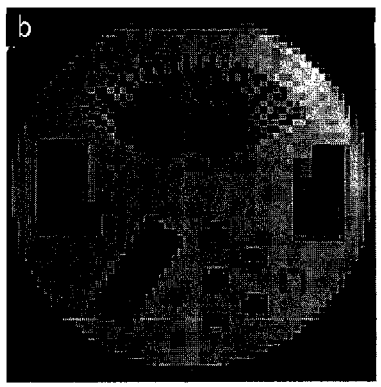
FIG. 7b illustrates an image of a resolution phantom acquired with gradient echo images with echo times of 10 ms.
Figure 7C:
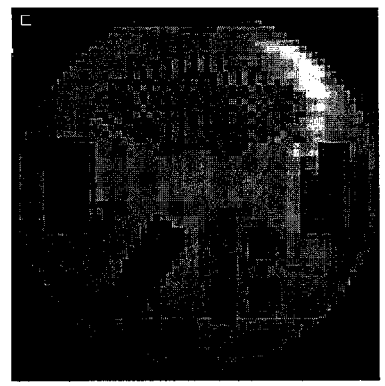
FIG. 7c illustrates an image of a resolution phantom acquired with gradient echo images with echo times of 20 ms.

FIGS. 7a-7c illustrate images of resolution phantoms comparing RASER to gradient echo imaging. A single shot RASER image is shown in FIG. 7a. Gradient echo images with echo times of 10 ms and 20 ms are shown in FIGS. 7b and 7c respectively. It can be seen that RASER is free from susceptibility artifacts that quickly degrade a gradient echo image.

FIG. 7a shows a single-shot RASER image of the resolution phantom using TE=140 ms. FIG. 7b shows an image acquired with a gradient-echo sequence (GEMS) using the same resolution, but with TE=10 ms. To reveal the susceptibility gradients which are not a problem for RASER, the GEMS acquisition was repeated with TE=20 ms (FIG. 7c). At echo times greater than 30 ms, the GEMS images are not discernable due to susceptibility artifacts. The pixels containing a frequency-shifted resonance (e.g., lipid) are displaced in the direction of the time-encoding gradient, as occurs in the frequency-encoded direction in both RASER and conventional images.

Figures 8A, 8B:
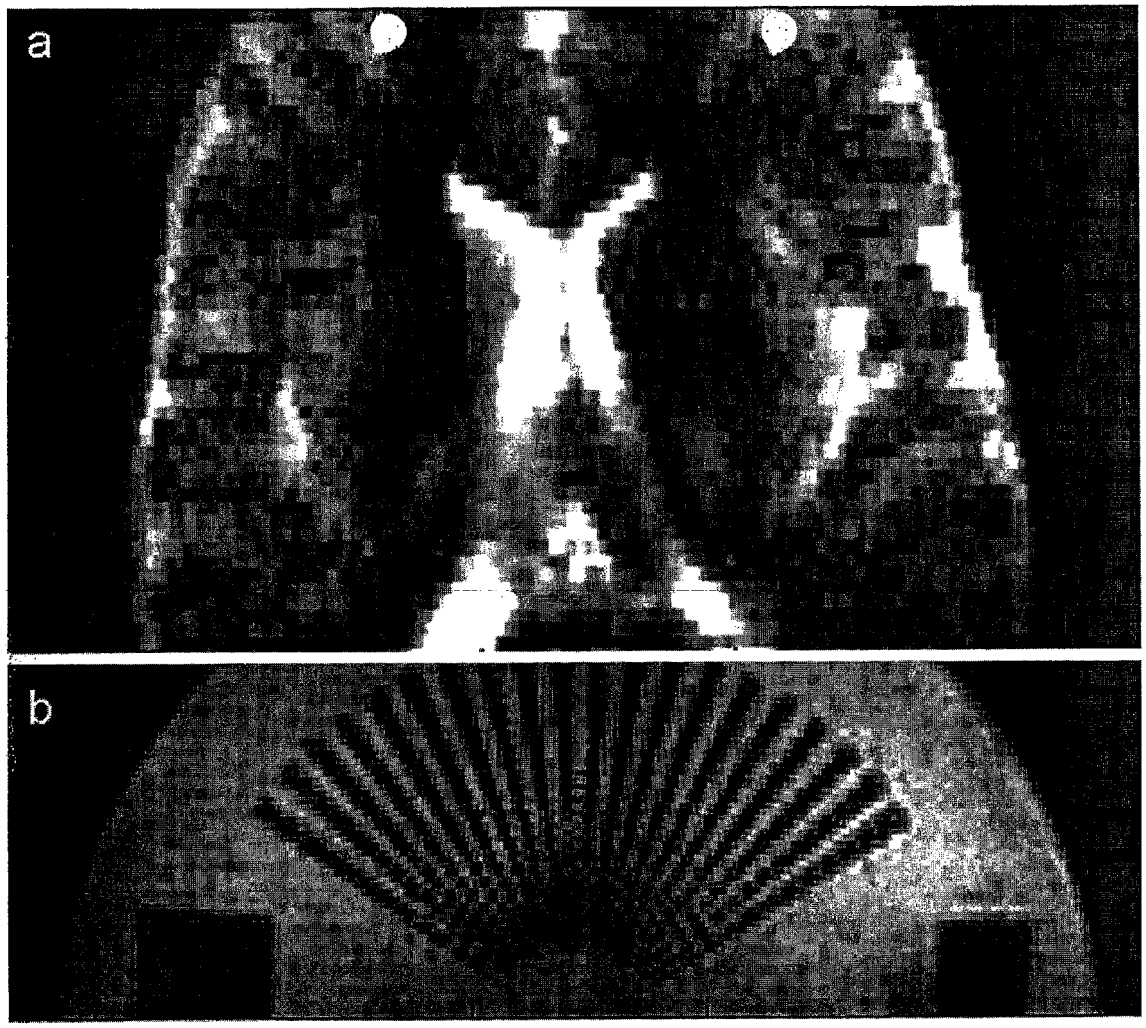
FIG. 8a illustrates a zoomed single-shot image of a human brain, in accordance with one embodiment.
FIG. 8b illustrates a zoomed single-shot image of a resolution phantom with nine averages, in accordance with one embodiment.
Figure 4A:
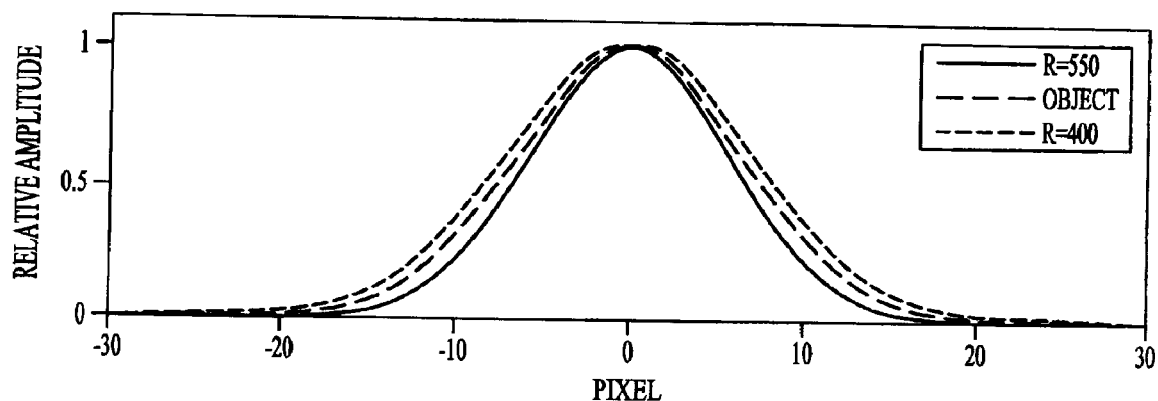
Figure 4B:
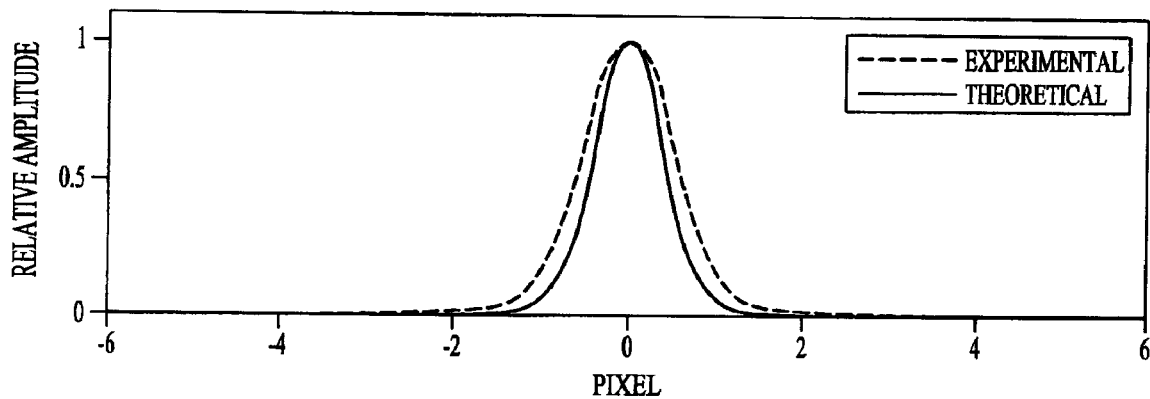
Figure 4C:
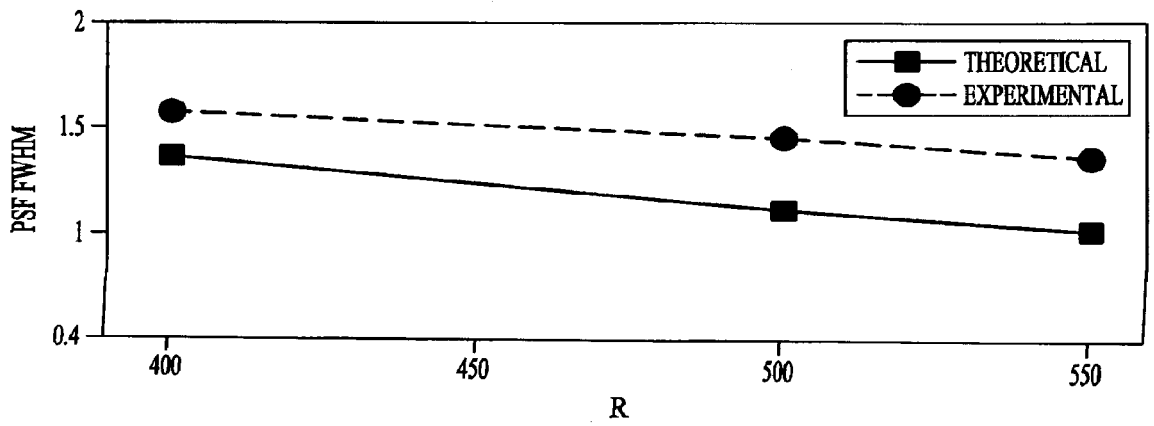

RASER offers the capability to restrict the FOV in the time-encoded direction (i.e., zoom), while avoiding some of the image artifacts that often plague such techniques (e.g., aliased signals). FIGS. 8a and 8b illustrate zoomed images obtained with the single-shot version of RASER using a continuously applied time-encoding gradient during readout, instead of the blipped gradients. FIG. 8a illustrates a zoomed single shot image of a human brain. FIG. 8b illustrates a zoomed single shot image of a resolution phantom with nine averages. As previously discussed, in some embodiments, the linear phase shift that occurs in the readout direction is removed prior to Fourier transforming the echo. This may be accomplished by subtracting the phase shift due to the time-encoding gradient from each point acquired. These images demonstrate the zoom imaging feature of RASER. In RASER, the FOV in the time-encoding direction is set by the slab thickness, so there is no need to set the FOV bigger than the slab to prevent folding near its borders.

Estimation of Specific Absorption Rate

Bloch simulations were used to estimate the relative SAR of sequences using the same repetition time (TR). The average SAR of the following sequences was estimated: RASER, conventional spin-echo EPI, multislice spin-echo, and fast spin-echo using 180° refocusing pulses. RASER calculations used the chirp pulses previously described, whereas the 90° pulse in the other spin-echo sequences was a 4 ms sinc pulse ($\gamma B_1/2\pi=350$ Hz). The 180° pulses in all calculations were 4 ms sinc pulses ($\gamma B_1/2\pi=700$ Hz). The average SAR in RASER was a factor of 5.28 greater than that of spin-echo EPI and was less than that in multislice spin echo once the number of slices was greater than 5. The average SAR in RASER was less than that in fast spin echo once the echo train length was greater than 6.

CONCLUSION

A method of magnetic resonance imaging based on rapid acquisition by sequential excitation and refocusing is provided. In one embodiment, the method comprises turning on a first time-encoding gradient, the excitation gradient, and applying an excitation pulse in the presence of the first time-encoding gradient. The excitation pulse excites magnetization sequentially along one spatial axis. Thereafter, a first refocusing pulse is applied. A second time-encoding gradient, the refocusing gradient, is turned on followed by a second refocusing pulse. A third time-encoding gradient, the acquisition gradient, and an alternating gradient are turned on and a signal is acquired in the presence of the third time-encoding gradient and the alternating gradient. The acquired signal is time-encoded and frequency-encoded. The third time-encoding gradient sums to zero with the first time-encoding gradient and the second time-encoding gradient for sequential points in space.

Further information regarding the RASER method is available at Chamberlain R, Park J Y, Corum C, Yacoub E, Ugurbil K, Jack C R, Garwood M G. RASER: A new ultrafast magnetic resonance imaging method. Magn Reson Med 2007; 58:794-799, herein incorporated by reference. Although the invention has been described with reference to specific embodiments, persons skilled in the art will recognize that changes may be made in form and detail without departing from the spirit and scope of the invention.

What is claimed is:

1. A method of magnetic resonance imaging comprising:
   applying a substantially static magnetic field to an object;
   applying an excitation pulse to the object;
   applying an acquisition gradient in a time-encoding direction during an acquisition window;
   applying on an alternating frequency-encoding gradient in a frequency-encoding direction, the frequency-encoding direction different from the acquisition gradient;
   acquiring a signal in the presence of the acquisition gradient and the alternating gradient, the signal being time-encoded, frequency-encoded, and being substantially contiguous; and
   using the signal, and at least one processor, to create an image having at least two dimensions of the object.

2. The method of claim 1, further comprising applying a selection gradient and wherein the excitation pulse is applied in the presence of the selection gradient.

3. The method of claim 2, further comprising applying a first refocusing pulse, applying a refocusing gradient, and applying a second refocusing pulse.

4. The method of claim 3, wherein the excitation pulse excites isochromats to precess in a transverse plane, wherein the excitation gradient causes each isochromat to experience a different amount of dephasing, and wherein the first and second refocusing pulses and the acquisition gradient rephase the isochromats sequentially.

5. The method of claim 3, wherein the acquisition gradient sums to zero with the selection gradient and the refocusing gradient.

6. The method of claim 5, further comprising applying a phase-encoding gradient after applying the excitation pulse and before applying the first refocusing pulse, wherein a plurality of slices are acquired.

7. The method of claim 6, wherein the slices are overlapped.

8. The method of claim 6, wherein the slices are spaced.

9. The method of claim 6, wherein the time-encoding direction of the acquisition gradient is through-plane.

10. The method of claim 6, wherein the phase-encoding gradient has a phase-encoding direction and further wherein using the signal includes performing a first Fourier transform in the frequency-encoding direction and performing a second Fourier transform in the phase-encoding direction.

11. The method of claim 5, further comprising applying a first slice selection gradient approximately concurrently with the first refocusing pulse and applying a second slice selection gradient approximately concurrently with the second refocusing pulse.

12. The method of claim 11, wherein the time-encoding direction of the acquisition gradient is through-plane.

13. The method of claim 5, wherein the acquisition gradient is blipped.

14. The method of claim 5, wherein the acquisition gradient is continuous.

15. The method of claim 3, wherein applying the first refocusing pulse and applying the second refocusing pulse includes applying two 180 degree pulses.

16. The method of 1, wherein the excitation pulse has varied frequency.

17. The method of claim 1, wherein the excitation pulse has varied gradient.

18. The method of claim 1, wherein the excitation pulse includes a chirp pulse.

19. The method of claim 1, wherein the excitation pulse includes a hyperbolic secant pulse.

20. The method of claim 1, wherein applying the excitation pulse includes applying a 90 degree pulse.

21. The method of claim 1, wherein using the signal includes performing a Fourier transform.

22. The method of claim 1, wherein using the signal includes performing a Fourier transform in the frequency-encoding direction.

23. A method of magnetic resonance imaging comprising:
    applying a substantially static magnetic field to an object;
    applying excitation to the object;
    applying a time-encoding acquisition gradient in a time encoding direction and corresponding to the excitation;
    applying an alternating frequency-encoding gradient in a direction different than the time encoding direction and corresponding to the excitation;

acquiring a signal encoded in time using the time-encoding acquisition gradient and encoded in frequency using the alternating frequency-encoding gradient; and generating, using at least one processor, an image of the object using the signal.

24. The method of claim 23 wherein applying excitation includes applying a 90° frequency-swept pulse.

25. The method of claim 23 wherein applying excitation includes applying a frequency-swept pulse.

26. The method of claim 25 wherein applying the frequency-swept pulse includes applying an adiabatic pulse.

27. The method of claim 26 wherein applying the adiabatic pulse includes applying at least one of a hyperbolic secant pulse and a chirp pulse.

28. The method of claim 23 wherein applying excitation includes sequentially applying an excitation pulse and applying a refocusing pulse.

29. The method of claim 28 wherein applying the refocusing pulse includes applying a 180° pulse.

30. The method of claim 23 wherein applying excitation includes applying spiral excitation.

31. The method of claim 23 wherein applying excitation includes applying an excitation pulse having a constant frequency and a modulated gradient.

32. The method of claim 23 wherein generating the image includes generating a 3D image.

33. The method of claim 23 wherein generating the image includes calculating a Fourier transform using the signal.

* * * * *

UNITED STATES PATENT AND TRADEMARK OFFICE
CERTIFICATE OF CORRECTION

| | | |
|---|---|---|
| PATENT NO. | : 7,786,729 B2 | |
| APPLICATION NO. | : 11/931968 | |
| DATED | : August 31, 2010 | |
| INVENTOR(S) | : Ryan Chamberlain et al. | |

It is certified that error appears in the above-identified patent and that said Letters Patent is hereby corrected as shown below:

On page 2, in column 2, under "Other Publications", line 8, delete "Continous" and insert -- Continuous --, therefor.

Figure 4D:
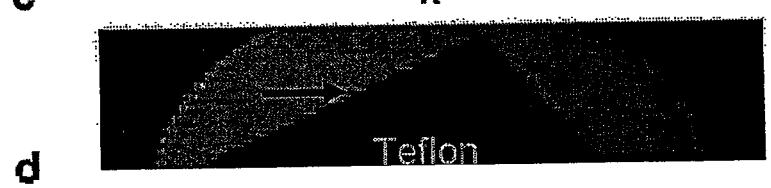

On sheet 4 of 8, Figure 4d, below "Figure 4c" delete "Figure 4d".
Drawing sheet attached.

In column 1, line 10, after "reference" insert -- . --.

In column 6, line 62, delete "$T_2$" and insert -- $T_2^*$ --, therefor.

In column 9, line 53, after "refocusing" delete "gradient".

In column 9, line 65, delete "1b and 1c." and insert -- 2b and 2c. --, therefor.

In column 14, line 23, Delete "FIG. 46" and insert -- FIG. 6c --, therefor.

In column 15, line 59, in Claim 1, after "applying" delete "on".

In column 16, line 44, in Claim 16, delete "1," and insert -- claim 1, --, therefor.

Signed and Sealed this
First Day of March, 2011

David J. Kappos
*Director of the United States Patent and Trademark Office*